United States Patent
Jin et al.

(10) Patent No.: US 10,409,340 B2
(45) Date of Patent: Sep. 10, 2019

(54) ELECTRONIC DEVICE

(71) Applicant: Huawei Technologies Co., Ltd., Shenzhen (CN)

(72) Inventors: Linfang Jin, Shenzhen (CN); Xiaowei Hui, Shenzhen (CN); Xiangyang Yang, Shanghai (CN); Shaoxin Zhou, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/311,927

(22) PCT Filed: Jun. 4, 2014

(86) PCT No.: PCT/CN2014/079149
§ 371 (c)(1),
(2) Date: Nov. 17, 2016

(87) PCT Pub. No.: WO2015/184603
PCT Pub. Date: Dec. 10, 2015

(65) Prior Publication Data
US 2017/0102745 A1    Apr. 13, 2017

(51) Int. Cl.
*G06F 1/20* (2006.01)
*F28D 15/02* (2006.01)
*H05K 7/20* (2006.01)

(52) U.S. Cl.
CPC ........... *G06F 1/20* (2013.01); *F28D 15/0275* (2013.01); *G06F 1/203* (2013.01); *H05K 7/2039* (2013.01); *H05K 7/20336* (2013.01)

(58) Field of Classification Search
CPC .............................. G06F 1/20; H05K 7/20336
See application file for complete search history.

(56) References Cited

U.S. PATENT DOCUMENTS 5,355,942 A * 10/1994 Conte ................. F28D 15/0233
                                                    165/104.33
5,513,070 A *  4/1996 Xie .......................... G06F 1/203
                                                    165/185
(Continued)

FOREIGN PATENT DOCUMENTS

CN        2671129 Y    1/2005
CN        1928484 A    3/2007
(Continued)

OTHER PUBLICATIONS

Machine Translation and Abstract of Chinese Publication No. CN201541416, Aug. 4, 2010, 4 pages.
(Continued)

*Primary Examiner* — David M Sinclair
*Assistant Examiner* — Robert D Brown
(74) *Attorney, Agent, or Firm* — Conley Rose, P.C.

(57) ABSTRACT

An electronic device is provided. The electronic device includes a heat emitting element, and the heat emitting element is disposed on a circuit board PCB. The electronic device further includes a heat pipe group. The heat pipe group includes at least two heat pipes, and the heat pipe group is located on the heat emitting element. The heat pipes in the heat pipe group have at least one different characteristic parameter. Optimal working regions of the heat pipes in the heat pipe group are different. When the heat pipes in the heat pipe group work in the corresponding optimal working regions, thermal resistance ranges of the at least two heat pipes in the heat pipe group are 0.05-1° C./W.

14 Claims, 3 Drawing Sheets

(56) References Cited

U.S. PATENT DOCUMENTS

| | | | | |
|---|---|---|---|---|
| 6,349,035 B1* | 2/2002 | Koenen | ............... | H01L 23/4093 |
| | | | | 257/727 |
| 6,937,474 B2* | 8/2005 | Lee | ............... | H01L 23/427 |
| | | | | 165/104.21 |
| 7,511,947 B2* | 3/2009 | Leng | ............... | H01L 23/427 |
| | | | | 165/104.21 |
| 7,515,423 B2* | 4/2009 | Peng | ............... | H05K 7/20936 |
| | | | | 165/104.21 |
| 2005/0098300 A1* | 5/2005 | Kawabata | ............... | F28D 15/0233 |
| | | | | 165/80.3 |
| 2006/0067045 A1* | 3/2006 | Ali | ............... | G06F 1/203 |
| | | | | 361/679.47 |
| 2008/0062649 A1* | 3/2008 | Leng | ............... | H01L 23/427 |
| | | | | 361/700 |
| 2009/0277614 A1* | 11/2009 | Lin | ............... | F28D 15/0233 |
| | | | | 165/104.26 |
| 2009/0279255 A1* | 11/2009 | Sauciuc | ............... | H05K 7/20163 |
| | | | | 361/697 |
| 2010/0172088 A1* | 7/2010 | Lian | ............... | G06F 1/20 |
| | | | | 361/679.47 |
| 2010/0188811 A1* | 7/2010 | Liang | ............... | G06F 1/20 |
| | | | | 361/679.52 |
| 2011/0005727 A1* | 1/2011 | Yu | ............... | F28D 15/0233 |
| | | | | 165/104.26 |
| 2011/0048677 A1* | 3/2011 | Lin | ............... | F28D 15/0275 |
| | | | | 165/104.26 |
| 2011/0170264 A1* | 7/2011 | Lee | ............... | G06F 1/183 |
| | | | | 361/700 |
| 2012/0012281 A1* | 1/2012 | Franz | ............... | G06F 1/20 |
| | | | | 165/104.26 |
| 2013/0105123 A1* | 5/2013 | Chen | ............... | H01L 23/36 |
| | | | | 165/104.26 |
| 2013/0105131 A1 | 5/2013 | Chen et al. | | |
| 2013/0128461 A1* | 5/2013 | Nagasawa | ............... | G06F 1/20 |
| | | | | 361/704 |
| 2014/0247555 A1* | 9/2014 | Arvelo | ............... | H05K 7/20772 |
| | | | | 361/699 |
| 2016/0295739 A1* | 10/2016 | Ahamed | ............... | F28D 15/0275 |

FOREIGN PATENT DOCUMENTS

| | | |
|---|---|---|
| CN | 1985231 A | 6/2007 |
| CN | 101374401 A | 2/2009 |
| CN | 201541416 U | 8/2010 |
| CN | 103021877 A | 4/2013 |
| CN | 103228118 A | 7/2013 |
| CN | 203243660 U | 10/2013 |
| JP | H08130385 A | 5/1996 |
| JP | 2003218570 A | 7/2003 |
| JP | 2011124456 A | 6/2011 |
| WO | 2005013657 A1 | 2/2005 |
| WO | 2009121737 A1 | 10/2009 |
| WO | 2014077081 A1 | 5/2014 |

OTHER PUBLICATIONS

Machine Translation and Abstract of Chinese Publication No. CN1928484, Mar. 14, 2007, 8 pages.
Machine Translation and Abstract of European Publication No. WO2009121737, Oct. 8, 2009, 8 pages.
Foreign Communication From a Counterpart Application, European Application No. 14894059.6, Extended European Search Report dated Mar. 23, 2017, 11 pages.
Foreign Communication From a Counterpart Application, Chinese Application No. 201480001490.5, Chinese Office Action dated Apr. 26, 2017, 10 pages.
Foreign Communication From a Counterpart Application, PCT Application No. PCT/CN2014/079149, English Translation of International Search Report dated Dec. 30, 2014, 3 pages.
Foreign Communication From a Counterpart Application, PCT Application No. PCT/CN2014/079149, English Translation of Written Opinion dated Dec. 30, 2014, 14 pages.
Machine Translation and Abstract of Japanese Publication No. JP2011124456, Jun. 23, 2011, 34 pages.
Machine Translation and Abstract of Japanese Publication No. JPH08130385, May 21, 1996, 13 pages.
Foreign Communication From a Counterpart Application, Japanese Application No. 2016-566282, Japanese Notice of Rejection dated Aug. 7, 2018, 3 pages.
Foreign Communication From a Counterpart Application, Japanese Application No. 2016-566282, English Translation of Japanese Notice of Rejection dated Aug. 7, 2018, 5 pages.
Machine Translation and Abstract of International Publication No. WO2014077081, May 22, 2014, 133 pages.
Foreign Communication From a Counterpart Application, European Application No. 14894059.6, European Office Action dated Mar. 18, 2019, 10 pages.
Machine Translation and Abstract of Japanese Publication No. JP2003218570, Jul. 31, 2003, 15 pages.
Machine Translation and Abstract of International Publication No. WO2005013657, Feb. 10, 2005, 28 pages.
Foreign Communication From a Counterpart Application, Japanese Application No. 2016-566282, Japanese Office Action dated Dec. 13, 2017, 3 pages.
Foreign Communication From a Counterpart Application, Japanese Application No. 2016-566282, English Translation of Japanese Office Action dated Dec. 19, 2017, 6 pages.

* cited by examiner

ELECTRONIC DEVICE

CROSS-REFERENCE TO RELATED APPLICATIONS

This application is a national stage application of international patent application number PCT/CN2014/079149 filed on Jun. 4, 2014, which is incorporated by reference.

TECHNICAL FIELD

The present disclosure relates to the field of heat dissipation technologies, and in particular, to an electronic device.

BACKGROUND

With rapid popularization of a Long-Term Evolution (LTE) technology, mobile internet provides a multimedia application with high definition and high performance. As a result, a mobile data service grows rapidly, and power consumption of a mobile terminal device increases significantly, which poses an unprecedented challenge to heat dissipation design within limited space.

A high-temperature surface region for heat dissipation during working of a mobile terminal device is corresponding to a position of a main central processing unit (CPU) on an L-shaped printed circuit board (PCB). Because power consumption is concentrated in a CPU and a graphics processing unit (GPU), temperature distribution in thermal design is seriously uneven. Heat conduction performance of a die casting magnesium alloy (a coefficient of thermal conductivity k: k≤70 watts per meter Kelvin (W/m-K)) and a graphite film (a thickness t: t=0.02–0.1 millimeters (mm); a coefficient of thermal conductivity k: k=−1200 W/m-K) that originally connect a cold region and a hot region cannot meet a higher thermal design requirement of a user. Therefore, how to effectively dissipate heat of a mobile terminal is an urgent problem that needs to be resolved in the industry.

SUMMARY

The present disclosure provides an electronic device to resolve a technical problem in some approaches that an electronic device has poor heat dissipation performance, and to improve the heat dissipation performance of the electronic device.

According to a first aspect, an embodiment of this application provides an electronic device, where the electronic device includes a heat emitting element, the heat emitting element is disposed on a PCB, and the electronic device further includes a heat pipe group, where the heat pipe group includes at least two heat pipes, the heat pipe group is located on the heat emitting element, the heat pipes in the heat pipe group have at least one different characteristic parameter, optimal working regions of the heat pipes in the heat pipe group are different, and when the heat pipes in the heat pipe group work in the corresponding optimal working regions, thermal resistance ranges of the heat pipes in the heat pipe group are 0.05-1 degrees Celsius per watt (° C./W).

With reference to the first aspect, in a first possible implementation manner, the characteristic parameter is one or more of a pipe diameter of a heat pipe, a capillary layer cross-sectional area of a heat pipe, a working substance amount of a heat pipe, a working substance type of a heat pipe, a pipe material of a heat pipe, or a pipe material thickness of heat pipes of a same pipe material.

With reference to the first aspect or the first possible implementation manner of the first aspect, in a second possible implementation manner, a thermal interface material is disposed between the heat emitting element and the heat pipe group.

With reference to any one of the first aspect, or the first possible implementation manner to the second possible implementation manner of the first aspect, in a third possible implementation manner, the heat emitting element is a CPU, a GPU, or a CPU and a GPU.

With reference to the first possible implementation manner, in a fourth possible implementation manner, the heat pipe group includes two heat pipes, where the characteristic parameter is the pipe diameter of a heat pipe, and a pipe diameter of a first heat pipe is different from that of a second heat pipe in the two heat pipes, and if the first heat pipe and the second heat pipe have same other characteristic parameters except the pipe diameter of a heat pipe, and the pipe diameter of the first heat pipe is greater than the pipe diameter of the second heat pipe, the first heat pipe is a high-temperature efficient heat pipe, and the second heat pipe is a low-temperature efficient heat pipe; or the characteristic parameter is the capillary layer cross-sectional area of a heat pipe, and a capillary layer cross-sectional area of a first heat pipe is different from that of a second heat pipe in the two heat pipes, and if the first heat pipe and the second heat pipe have same other characteristic parameters except the capillary layer cross-sectional area of a heat pipe, and the capillary layer cross-sectional area of the first heat pipe is greater than the capillary layer cross-sectional area of the second heat pipe, the first heat pipe is a high-temperature efficient heat pipe, and the second heat pipe is a low-temperature efficient heat pipe; or the characteristic parameter is the working substance amount of a heat pipe, and a working substance amount of a first heat pipe is different from that of a second heat pipe in the two heat pipes, and if the first heat pipe and the second heat pipe have same other characteristic parameters except the working substance amount of a heat pipe, an amount of working substance injected into the first heat pipe is equal to an actual capillary requirement, and an amount of working substance injected into the second heat pipe is less than the actual capillary requirement, the first heat pipe is a high-temperature efficient heat pipe, and the second heat pipe is a low-temperature efficient heat pipe; or the characteristic parameter is a working substance of a heat pipe, and a working substance of a first heat pipe is different from that of a second heat pipe in the two heat pipes, and if the first heat pipe and the second heat pipe have same other characteristic parameters except latent heat of a heat pipe, and latent heat of the working substance of the first heat pipe is greater than latent heat of the working substance of the second heat pipe, the first heat pipe is a high-temperature efficient heat pipe, and the second heat pipe is a low-temperature efficient heat pipe.

According to a second aspect, an electronic device is provided, where the electronic device includes a heat emitting element, the heat emitting element is disposed on a PCB, and the electronic device further includes a heat pipe, where the heat pipe includes at least two independent heat conduction paths, the heat pipe is located on the heat emitting element, the heat conduction paths in the heat pipe have at least one different characteristic parameter, optimal working regions of the heat conduction paths in the heat pipe are different, and when the heat conduction paths in the heat pipe work in the corresponding optimal working regions, thermal resistance ranges of the heat conduction paths in the heat pipe are 0.05-1° C./W.

With reference to the second aspect, in a second possible implementation manner, the characteristic parameter is one or more of a diameter of a heat conduction path, a capillary layer cross-sectional area of a heat conduction path, a working substance amount of a heat conduction path, a working substance type of a heat conduction path, a pipe material of a heat conduction path, or a pipe material thickness of a heat conduction path.

With reference to the second aspect or the first possible implementation manner of the second aspect, in a second possible implementation manner, a thermal interface material is disposed between the heat emitting element and the heat pipe.

According to a third aspect, an electronic device is provided, where the electronic device includes a heat emitting element, the heat emitting element is disposed on a circuit board PCB, and the electronic device further includes a first heat pipe and a second heat pipe, where the first heat pipe and the heat emitting element are disposed on a same side of the PCB, and the first heat pipe is connected to the heat emitting element; the second heat pipe is disposed in a second position of the PCB, and the second heat pipe is connected to the heat emitting element by using a thermally conductive metal, where the heat emitting element is disposed on a back surface of the second position of the PCB; and the first heat pipe is different from the second heat pipe in terms of at least one characteristic parameter, optimal working regions of the first heat pipe and the second heat pipe are different, and when the first heat pipe and the second heat pipe work in the corresponding optimal working regions, thermal resistance ranges of the first heat pipe and the second heat pipe are 0.05-1° C./W.

With reference to the third aspect, in a first possible implementation manner, that the first heat pipe is connected to the heat emitting element is the first heat pipe is located on the heat emitting element, and a thermal interface material is disposed between the first heat pipe and the heat emitting element; or the first heat pipe is connected to the heat emitting element by using the thermally conductive metal, and the thermally conductive metal is a copper layer of the PCB.

With reference to the third aspect, in a second possible implementation manner, the characteristic parameter is one or more of a pipe diameter of a heat pipe, a capillary layer cross-sectional area of a heat pipe, a working substance amount of a heat pipe, a working substance type of a heat pipe, a pipe material of a heat pipe, or a pipe material thickness of heat pipes of a same pipe material.

One or more foregoing technical solutions in the embodiments of this application have at least the following beneficial effects: in the solution provided in the embodiments of the present disclosure, a heat pipe is used to implement heat dissipation of a mobile electronic device; and in the solution provided in the present disclosure, a corresponding heat pipe group is disposed on a same heat emitting element according to a characteristic that heat of a heat emitting element changes with different working states of the electronic device, where the heat pipe group includes at least two heat pipes, and optimal working regions of the heat pipes are different, that is, maximum heat transfer quantities of the heat pipes are different, so that the heat pipes with different characteristic parameters may perform heat dissipation according to the different working states of the heat emitting element.

DESCRIPTION OF EMBODIMENTS

Figure 1:
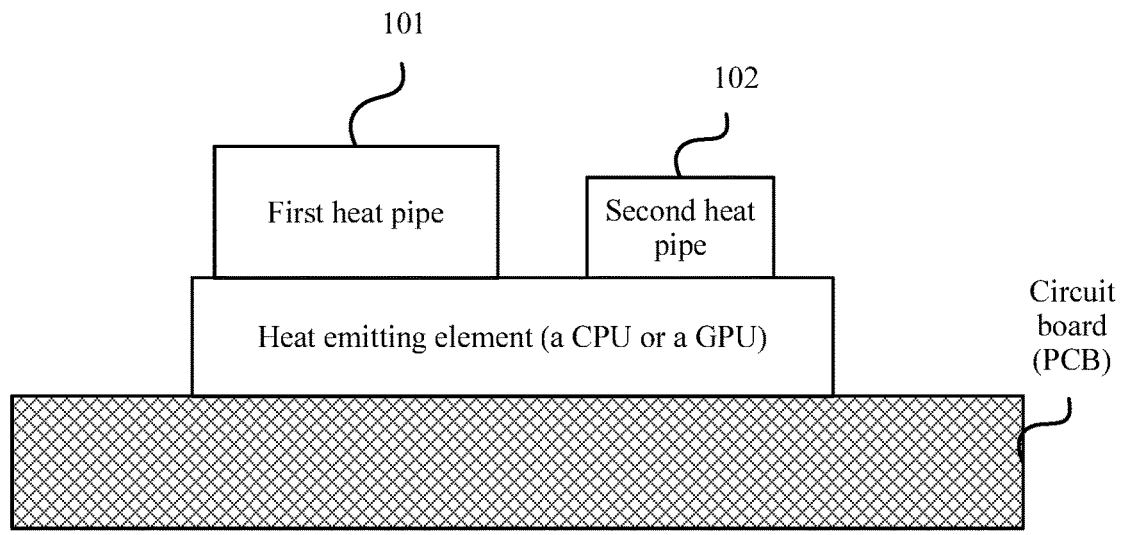
FIG. 1 is a schematic structural diagram of an electronic device according to Manner 1 in Embodiment 1 of this application.

A heat pipe is an effective heat transfer element. The heat pipe is highly effective in heat conduction, and generally includes a pipe housing, a pipe core, and a working substance (a working medium). The heat pipe (a coefficient of thermal conductivity k: k>5000 W/m-K) becomes a major choice for a solution to an overheating chip of a mobile terminal device.

Heat emitting of the mobile terminal device is not constant, and changes at any time according to an application running on the mobile terminal device. A change range is relatively large. Therefore, when there is a relatively large difference between heat to be dissipated at high power consumption and heat to be dissipated at low power consumption of the mobile terminal device, it is difficult for one heat pipe to perform heat dissipation at both a low power consumption region and high power consumption of the mobile terminal device. As a result, it is difficult to achieve a desirable heat dissipation effect. For example, When the mobile terminal device runs an application with high power consumption (maximum power consumption $Qmax\_DP>8$ watts (W), where DP stands for design power) by using a CPU at full load, a heat pipe with a maximum heat transfer amount $Qmax\_HP \geq 8$ W needs to be used to perform heat dissipation, where HP stands for heat pipe. However, normally, when a user uses a mobile terminal, power consumption ($Qnormal\_DP$) is generally as follows: $Qnormal\_DP<3$ W. Correspondingly, a heat pipe with $Qmax\_HP \geq 3$ W may be used to perform heat dissipation. Therefore, if one heat pipe is used, and there is the relatively large difference between the heat to be dissipated at the high power consumption and the heat to be dissipated at the low power consumption of the mobile terminal device, the heat pipe generally cannot achieve the desirable heat dissipation effect.

To make objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are a part rather than all of the embodiments of the present disclosure. All other embodiments obtained by a person of ordinary skill in the art based on the embodiments of the present disclosure without creative efforts shall fall within the protection scope of the present disclosure.

For a heat pipe, different characteristics of the heat pipe are corresponding to different maximum heat transfer quantities ($Qmax\_HP$) of the heat pipe. The characteristics of a heat pipe include a size, a diameter, a length, and the like of the heat pipe. Qmax_HP corresponding to each heat pipe obtained after being designed is a fixed value. When the heat pipe works in an optimal working region (when thermal resistance is the lowest), the heat pipe has optimal heat conduction performance. When a heat emitting element works at low power consumption, because the heat pipe is not fully started to work, a thermal resistance value is relatively large. When the heat emitting element works at high power consumption (exceeding Qmax_HP), a working substance of the heat pipe cannot be supplemented in time, and therefore, a requirement of a hot region for working cannot be met, which causes problems that a hot end of the heat pipe is dried due to boiling, and a temperature of the heat emitting element (for example, a CPU or a GPU) rises continuously.

The heat emitting element mentioned in the embodiments of the present disclosure refers to an element that dissipates heat to a surrounding environment in a working process, for example, a CPU and a GPU that are most common in an electronic device. However, the heat emitting element mentioned in the embodiments of the present disclosure is not limited to the two elements of the CPU and the GPU.

Considering that the foregoing characteristics and problems may occur when one heat pipe is used to dissipate heat of an electronic device, after the foregoing problems and the foregoing characteristics of the heat pipe are analyzed comprehensively, the embodiments of the present disclosure provide an electronic device. The electronic device includes a heat emitting element, where the heat emitting element is disposed on a PCB; and a heat pipe group, where the heat pipe group includes at least two heat pipes, the heat pipe group is located on the heat emitting element, the heat pipes in the heat pipe group have at least one different characteristic parameter, optimal working regions of the heat pipes in the heat pipe group are different, and when the heat pipes in the heat pipe group work in the corresponding optimal working regions, thermal resistance ranges of the at least two heat pipes in the heat pipe group are 0.05-1° C./W.

The characteristic parameter may be at least one or more of a pipe diameter of a heat pipe, a capillary layer cross-sectional area, a working substance amount (that is, a filling amount of working substance), a working substance type, a pipe material of a heat pipe (the pipe material of a heat pipe in the embodiments of the present disclosure may be copper or aluminum), or a pipe material thickness of heat pipes of a same pipe material.

It may be understood that the optimal working region may mean that when power consumption of the heat emitting element is relatively high (for example, the power consumption is approximately at least 10 W), one heat pipe in the heat pipe group performs heat dissipation on the heat emitting element, and in this case, thermal resistance of the heat pipe is relatively low or the lowest, where that the thermal resistance of the heat pipe is relatively low or the lowest is in relative to thermal resistance of the heat pipe when the heat pipe performs heat dissipation on the heat emitting element in another case; and when power consumption of the heat emitting element is relatively low (for example, the power consumption is approximately 2-3 W), another heat pipe in the heat pipe group performs heat dissipation on the heat emitting element, and in this case, thermal resistance of the another heat pipe is relatively low or the lowest, where that the thermal resistance of the another heat pipe is relatively low or the lowest is in relative to thermal resistance of the heat pipe when the heat pipe performs heat dissipation on the heat emitting element in another case.

That each heat pipe in the heat pipe group performs heat dissipation on the heat emitting element if thermal resistance of each heat pipe in the heat pipe group is relatively low or the lowest is that each heat pipe in the heat pipe group works in the corresponding optimal working region.

In view of a characteristic that heat of the heat emitting element changes with different working states of the electronic device, in the solutions provided in the embodiments of the present disclosure, a corresponding heat pipe group is disposed on a same heat emitting element, and the heat pipe group includes at least two heat pipes. Optimal working regions of the heat pipes are different, that is, maximum heat transfer quantities of the heat pipes may be different. Therefore, the heat pipes with different characteristic parameters may perform heat dissipation processing according to different working states of the heat emitting element.

The following describes in detail implementable implementation manners of the embodiments of the present disclosure with reference to the accompany drawings.

Embodiment 1

Referring to drawings, this embodiment of this application provides an electronic device. The electronic device includes a heat emitting element, where the heat emitting element is disposed on a PCB; and a heat pipe group, where the heat pipe group includes at least two heat pipes, the heat pipe group is located on the heat emitting element, the heat pipes in the heat pipe group have at least one different characteristic parameter, optimal working regions of the heat pipes in the heat pipe group are different, and when the heat pipes in the heat pipe group work in the corresponding optimal working regions, thermal resistance ranges of the at least two heat pipes in the heat pipe group are 0.05-1° C./W.

In this embodiment of the present disclosure, when the heat pipe works in the optimal working region, thermal resistance of the heat pipe may be 1° C./W. In a specific application, when the heat pipe works in the optimal working region, the thermal resistance of the heat pipe generally falls within a range of 0.05-1° C./W.

In this embodiment of the present disclosure, the characteristic parameter may be one or more of a pipe diameter of a heat pipe, a capillary layer cross-sectional area, a working substance amount (that is, a filling amount of working substance), a working substance type, a pipe material of a heat pipe (the pipe material of a heat pipe in this embodiment of the present disclosure may be copper or aluminum), or a pipe material thickness of heat pipes of a same pipe material. As the characteristic parameter of the heat pipe changes, the optimal working region or a maximum heat transfer amount of the heat pipe changes accordingly. Therefore, the characteristic parameters of the heat pipes in the heat pipe group are set to different values, so that the optimal working regions of the heat pipes in the heat pipe group do not overlap, and the heat pipes in the heat pipe group are respectively in the optimal working regions at different power consumption, which can meet heat conduction requirements of the heat emitting element in different scenarios.

In this embodiment of the present disclosure, the heat pipe group may include multiple heat pipes, and the optimal working regions of the heat pipes are different. The characteristic parameter of the heat pipe determines the optimal working region of the heat pipe. There are multiple characteristic parameters that determine the optimal working region of the heat pipe. The optimal working region of the heat pipe can be changed by changing any one of the characteristic parameters. Therefore, the heat pipes in this embodiment of the present disclosure are different from each other in terms of the characteristic parameter, and different optimal working regions of the heat pipes can be implemented in multiple manners. To describe in further detail the solution provided in this embodiment of the present disclosure, the following describes the solution in this embodiment of the present disclosure in terms of three relatively common characteristic parameters: the pipe diameter of a heat pipe, the parameter of the capillary layer cross-sectional area, the working substance amount, and the working substance type. Optional implementation manners include the following manners.

For ease of description, the following embodiment uses an example in which the heat pipe group includes two heat pipes. In specific implementation, the heat pipe group may also include multiple heat pipes, for example, three heat pipes or four heat pipes. For an implementation manner of the multiple heat pipes, reference may be made to an implementation manner of two heat pipes.

Manner 1: Change the characteristic parameter of the pipe diameter of a heat pipe in the characteristic parameters. An implementation manner corresponding to this embodiment of the present disclosure is as follows (a specific structure is shown in FIG. 1).

A pipe diameter of a first heat pipe 101 is different from that of a second heat pipe 102 in the two heat pipes. If the first heat pipe and the second heat pipe have same other characteristic parameters except the pipe diameter of a heat pipe, and the pipe diameter of the first heat pipe is greater than the pipe diameter of the second heat pipe, the first heat pipe is a high-temperature efficient heat pipe, and the second heat pipe is a low-temperature efficient heat pipe.

In this embodiment of the present disclosure, when the heat pipes in the heat pipe group are heat pipes with different diameters, a high-temperature efficient heat pipe is a heat pipe with a large diameter, and a low-temperature efficient heat pipe is a heat pipe with a small diameter. The heat pipes (of a normal parameter design) have different optimal working regions or heat transfer quantities due to different diameters of the heat pipes. Use of the heat pipes with different pipe diameters can ensure that optimal working regions of two heat pipes do not overlap. In this case, heat conduction requirements of a heat emitting element (for example, a CPU and/or a GPU) in different scenarios can be met.

Figure 2:
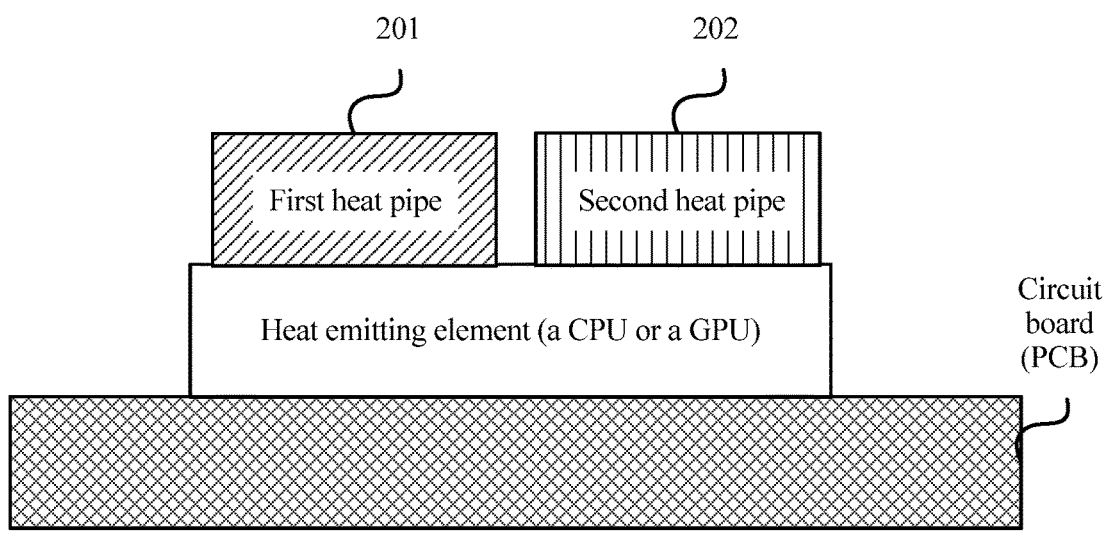
FIG. 2 is a schematic structural diagram of an electronic device according to Manner 2 in Embodiment 1 of this application.

Manner 2: Change the characteristic parameter of the capillary layer cross-sectional area of a heat pipe in the characteristic parameters. An implementation manner corresponding to this embodiment of the present disclosure is as follows (a specific structure is shown in FIG. 2).

A capillary layer cross-sectional area of a first heat pipe 201 is different from that of a second heat pipe 202 in the two heat pipes. If the first heat pipe and the second heat pipe have same other characteristic parameters except the capillary layer cross-sectional area of a heat pipe, and the capillary layer cross-sectional area of the first heat pipe 201 is greater than the capillary layer cross-sectional area of the second heat pipe 202, the first heat pipe 201 is a high-temperature efficient heat pipe, and the second heat pipe 202 is a low-temperature efficient heat pipe.

Different capillary layer cross-sectional areas may affect a heat transfer capability of a heat pipe. A capillary layer cross-sectional area of a low-temperature efficient heat pipe is smaller than a capillary layer cross-sectional area of a high-temperature efficient heat pipe. A capillary structure may be a sintered copper powder (powder) structure, a mesh (mesh) structure, a fiber (fiber) structure, or a groove (groove) structure.

A heat transfer amount of the low-temperature efficient heat pipe is relatively small. Therefore, when power consumption of a heat emitting element (may be a CPU and/or a GPU) is relatively low (the power consumption is approximately 2-3 W), the low-temperature efficient heat pipe is fully started to work, and works in an optimal working region, so as to have an effect of effectively dissipating heat of the heat emitting element at low power consumption.

However, when the power consumption of the heat emitting element (a CPU and/or a GPU) is relatively high (the power consumption is approximately at least 10 W), the high-temperature efficient heat pipe is fully started, and the high-temperature efficient heat pipe works in an optimal working region, so as to have an effect of effectively dissipating heat of the heat emitting element at high power consumption.

The capillary layer cross-sectional area is changed, so that the optimal working regions of the low temperature efficient heat pipe and the high temperature efficient heat pipe do not overlap. Therefore, heat dissipation requirements of the heat emitting element (may be a CPU and/or a GPU) in different working scenarios (corresponding to different power consumption of the heat emitting element) are ensured.

Manner 3: Change the characteristic parameter of the working substance amount in the characteristic parameters. An implementation manner corresponding to this embodiment of the present disclosure is as follows.

A working substance amount of a first heat pipe is different from that of a second heat pipe in the two heat pipes. If the first heat pipe and the second heat pipe have same other characteristic parameters except the working substance amount of a heat pipe, an amount of working substance injected into the first heat pipe is equal to an actual capillary requirement, and an amount of working substance injected into the second heat pipe is less than the actual capillary requirement, the first heat pipe is a high-temperature efficient heat pipe, and the second heat pipe is a low-temperature efficient heat pipe.

The working substance amount is changed, so that optimal working regions of a low-temperature efficient heat pipe and a high-temperature efficient heat pipe do not overlap. In a specific operation, the first heat pipe is filled with the working substance whose amount is equal to the actual capillary requirement, so that the optimal working region of the first heat pipe moves to higher power consumption, and the working substance of the first heat pipe fully works (to achieve a heat dissipation effect of the high-temperature efficient heat pipe) if power consumption of a heat emitting element is relatively high. As the low-temperature efficient heat pipe, the second heat pipe is injected with the working substance whose amount is less than the actual capillary requirement of a heat pipe, to keep the optimal working region of the second heat pipe moving towards relatively low power consumption, so that the working substance of the second heat pipe fully works if the power consumption of the heat emitting element is relatively low. Therefore, the high-temperature efficient heat pipe transfers heat in a case of relatively high power consumption, and the low-temperature efficient heat pipe is fully started to transfer heat in a case of low power consumption. It is ensured that the heat pipe group can always meet heat conduction requirements of the heat emitting element (a CPU and/or a GPU) in different working scenarios (different power consumption states of the heat emitting element).

Manner 4: Change the characteristic parameter of the working substance type of a heat pipe in the characteristic parameters. An implementation manner corresponding to this embodiment of the present disclosure is as follows.

A working substance type of a first heat pipe is different from that of a second heat pipe in the two heat pipes. If the first heat pipe and the second heat pipe have same other characteristic parameters except latent heat of a heat pipe, and latent heat of a working substance of the first heat pipe is greater than latent heat of a working substance of the second heat pipe, the first heat pipe is a high-temperature efficient heat pipe, and the second heat pipe is a low-temperature efficient heat pipe.

A heat transfer capability of a heat pipe is related to latent heat of a working substance. In order that an optimal working region of the first heat pipe is different from that of the second heat pipe in the two heat pipes, the working substance type of the first heat pipe is different from that of the second heat pipe in the two heat pipes. A working substance with relatively low latent heat, for example, methanol, R134A, or acetone, is added to the low-temperature efficient heat pipe, and a working substance with relatively high latent heat, for example, water, is added to the high-temperature efficient heat pipe, so that the two heat pipes have different heat transfer capabilities. Therefore, when a heat emitting element (for example, a CPU or a GPU) is in a low power consumption working scenario, the heat pipe filled with the working substance with low latent heat (that is, the low-temperature efficient heat pipe) starts working in the optimal working region, and the heat pipe filled with the working substance with high latent heat, such as water, (that is, the high-temperature efficient heat pipe) is not fully started. When the heat emitting element is in a high power consumption working scenario, the heat pipe filled with the working substance with high latent heat, such as water, (that is, the high temperature efficient heat pipe) is fully started to work. It is ensured that heat conduction requirements of the heat emitting element in different working scenarios (different power consumption states of the heat emitting element) are met.

Each manner of designing a heat pipe in the foregoing separately describes an impact of only one characteristic parameter of a heat pipe on an optimal working region of the heat pipe. However, in an actual application, multiple characteristic parameters of heat pipes in a heat pipe group may be set to be different values, so that optimal working regions corresponding to the heat pipes in the heat pipe group are different. The following further describes the solution provided in this embodiment of the present disclosure with reference to specific examples, and the solution includes the following content.

The following embodiment uses an example in which the heat pipe group includes two heat pipes. In specific implementation, the heat pipe group may include multiple heat pipes, and an implementation manner of the multiple heat pipes is the same as that of two heat pipes. If a characteristic parameter of the pipe diameter of a heat pipe is changed, optimal working regions of the two heat pipes are different. A high-temperature efficient heat pipe is a heat pipe with a large diameter, and a low-temperature efficient heat pipe is a heat pipe with a small diameter. However, on a basis of an actual need, the optimal working regions of the two heat pipes need to be further adjusted, and corresponding implementation manners may be further as follows.

(1) A capillary layer cross-sectional area of a first heat pipe is different from that of a second heat pipe in the heat pipe group. Generally, a heat transfer capability of a heat pipe decreases as a diameter of the heat pipe decreases, and a main reason of this is that the capillary layer cross-sectional areas designed in the heat pipes are different. Therefore, a heat pipe with a relatively small diameter is designed as a low-temperature efficient heat pipe, and a heat pipe with a relatively large diameter is designed as a high-temperature efficient heat pipe, where optimal working regions of the two heat pipes may be totally different. In addition, a capillary layer cross-sectional area of the low-temperature efficient heat pipe may be further reduced, so that the optimal working region of the low-temperature efficient heat pipe moves to lower power consumption, which can further ensure that the optimal working regions of the two heat pipes do not overlap. Therefore, heat conduction requirements of a heat emitting element (may be a CPU or a GPU) in different power consumption scenarios are implemented.

(2) A working substance amount of a first heat pipe is different from that of a second heat pipe in the heat pipe group. On a basis of different pipe diameters, a working substance amount of a low-temperature efficient heat pipe is reduced (a working substance amount of a high-temperature efficient heat pipe may or may not be increased at the same time), so that optimal working regions of the two heat pipes are further separated on the basis of changing the pipe diameter. Therefore, heat conduction requirements of a heat emitting element in different scenarios are implemented.

(3) A working substance of a first heat pipe is different from that of a second heat pipe in the heat pipe group are different. On a basis of different pipe diameters, a working substance filled in a low-temperature efficient heat pipe is changed to a working substance with relatively low latent heat, for example, methanol, tetrafluoroethane (R-134A), or acetone, so that an optimal working region of the low-temperature efficient heat pipe moves towards to a low power consumption region. Therefore, heat conduction requirements of a device in different scenarios are implemented.

The foregoing manners (1), (2), and (3) are described by using an example in which two characteristic parameters affect an optimal working region of a heat pipe. In an actual application, more parameters may be jointly used, so as to achieve an objective of different optimal working regions of the heat pipes in the heat pipe group. For example, a first heat pipe and a second heat pipe are heat pipes of different diameters. A smaller capillary layer cross-sectional area (smaller than a normal cross-sectional area) is designed for a low-temperature efficient heat pipe to which a working substance with low latent heat is further added, where a working substance amount is less than an amount in normal design, so that the low-temperature efficient heat pipe reaches an optimal working region at lower power consumption of a heat emitting element. Therefore, it can be ensured that the optimal working regions of the two heat pipes with different diameters do not overlap at all, and the heat pipe group can meet a heat conduction requirement of the heat emitting element for large-range heat dissipation.

In the foregoing embodiment, the heat pipe group may be attached to the heat emitting element in multiple manners. In a specific application, to achieve a better heat transfer effect, a thermal interface material is disposed between the heat pipe group and the heat emitting element.

In the foregoing embodiment, the heat pipe group is disposed as a whole on any heat emitting element. In a specific application, at least two heat pipes in the heat pipe group may be fastened to the heat emitting element by using a specific fastening element. In addition, in this embodiment, because each heat pipe works independently, the at least two heat pipes may exist independently, provided that heat pipes with different characteristic parameters are disposed on a same heat emitting element when the heat pipe group is disposed.

Embodiment 2

Figure 3:
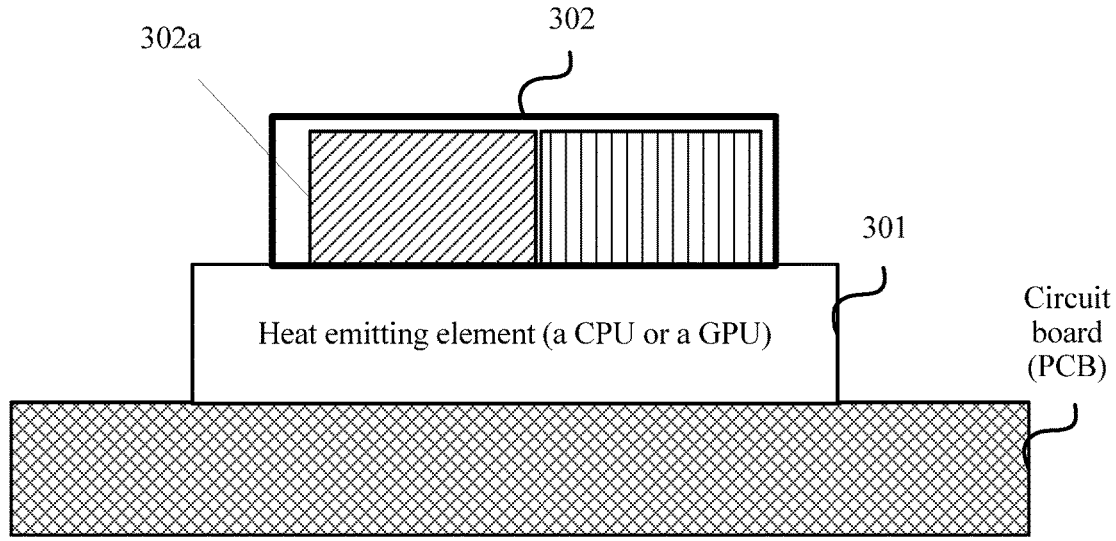
FIG. 3 is a schematic structural diagram of an electronic device according to Embodiment 2 of this application.

As shown in FIG. 3, this embodiment of the present disclosure further provides another electronic device. The electronic device includes a heat emitting element 301, and the heat emitting element 301 is disposed on a PCB. The electronic device further includes a heat pipe 302, where the heat pipe includes at least two independent heat conduction paths 302a, the heat pipe is located on the heat emitting element, the heat conduction paths 302a in the heat pipe have at least one different characteristic parameter, optimal working regions of the heat conduction paths 302a in the heat pipe are different, and when the heat conduction paths 302a in the heat pipe work in the corresponding optimal working regions, thermal resistance ranges of the heat conduction paths 302a in the heat pipe are 0.05-1° C./W.

In this embodiment of the present disclosure, the characteristic parameter may be one or more of a diameter of a heat conduction path, a capillary layer cross-sectional area of a heat conduction path, a working substance amount of a heat conduction path, a working substance type of a heat conduction path, a pipe material of a heat conduction path (the pipe material of a heat pipe in this embodiment of the present disclosure may be copper or aluminum), or a pipe material thickness of a heat conduction path. As the characteristic parameter of a heat pipe changes, an optimal working region or a maximum heat transfer amount of the heat pipe changes accordingly. Therefore, the characteristic parameters of the heat conduction paths in the heat pipe may be set to different values, so that the optimal working regions of the heat conduction paths in the heat pipe do not overlap, and the heat conduction paths in the heat pipe are respectively in the optimal working regions at different power consumption of the heat emitting element, which can meet heat conduction requirements of the heat emitting element in different scenarios.

In this embodiment of the present disclosure, the at least two independent heat conduction paths are different from each other in terms of at least one or more of the diameter, the capillary layer cross-sectional area, the working substance type, or the working substance amount.

In this embodiment of the present disclosure, the heat pipe includes multiple heat conduction paths with different working regions. Therefore, when the heat pipe provided in this embodiment of the present disclosure is compared with a heat pipe with only one heat conduction path, coverage area of the optimal working region of the heat pipe provided in the present disclosure is approximately doubled. When the heat pipe provided in this embodiment of the present disclosure is used to perform heat dissipation on any heat emitting element, heat dissipation requirements of the heat emitting element at different power consumption can be met to the greatest extent.

In the foregoing embodiment, the heat pipe group may be attached to the heat emitting element in multiple manners. In a specific application, to achieve a better heat transfer effect, a thermal interface material is disposed between the heat pipe group and the heat emitting element.

Embodiment 3

Figure 4:
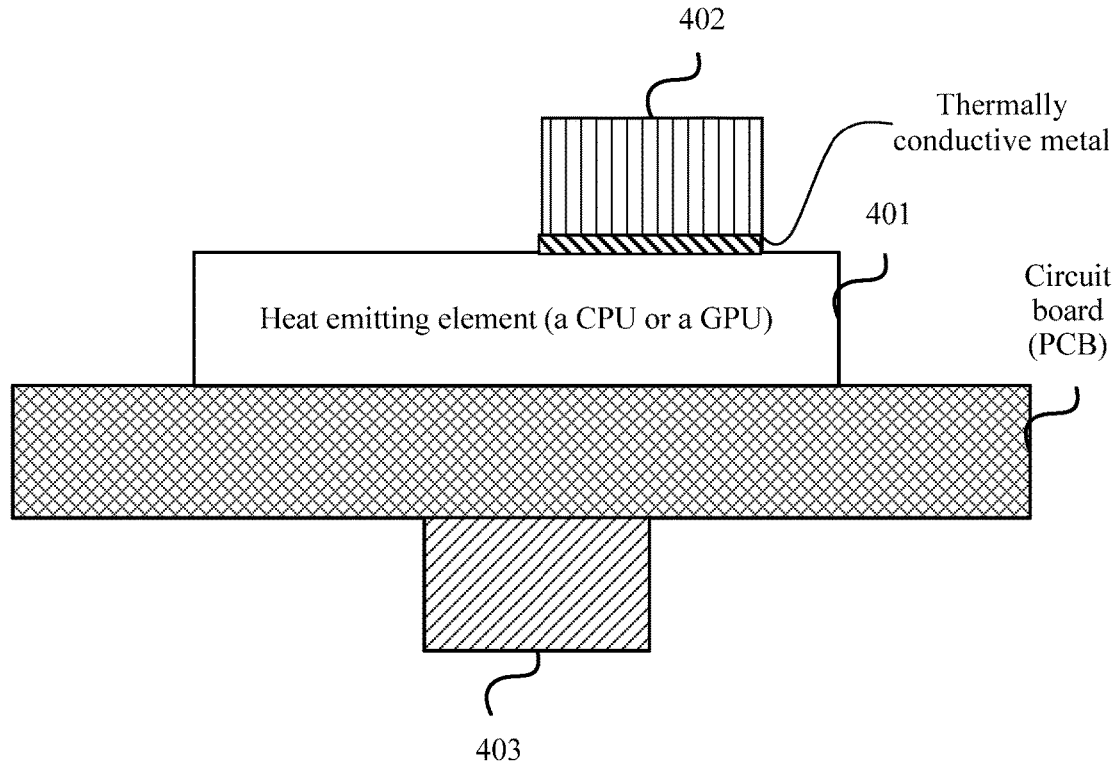
FIG. 4 is a schematic structural diagram of an electronic device according to Manner 1 in Embodiment 3 of this application.

As shown in FIG. 4, this embodiment of the present disclosure further provides another electronic device. The electronic device includes a heat emitting element 401, and the heat emitting element is disposed on a PCB. The electronic device further includes a first heat pipe 402 and a second heat pipe 403.

The first heat pipe 402 and the heat emitting element 401 are disposed on a same side surface of the PCB, and the first heat pipe 402 is connected to the heat emitting element 401.

The second heat pipe 403 is disposed in a second position of the PCB, and the second heat pipe is connected to the heat emitting element by using a thermally conductive metal, where the heat emitting element 401 is disposed on a back surface of the second position of the PCB.

The first heat pipe 402 is different from the second heat pipe 403 in terms of a characteristic parameter. Optimal working regions of the first heat pipe 402 and the second heat pipe 403 are different. When the first heat pipe 402 and the second heat pipe 403 work in the corresponding optimal working regions, thermal resistance ranges of the first heat pipe 402 and the second heat pipe 403 are 0.05-1° C./W.

In this embodiment of the present disclosure, the first heat pipe 402 may be connected to the heat emitting element 401 in multiple specific implementation manners. The following provides two optional manners.

As shown in FIG. 4, in a first manner, the first heat pipe 402 is located on the heat emitting element 401, and a thermal interface material is disposed between the first heat pipe and the heat emitting element.

Figure 5:
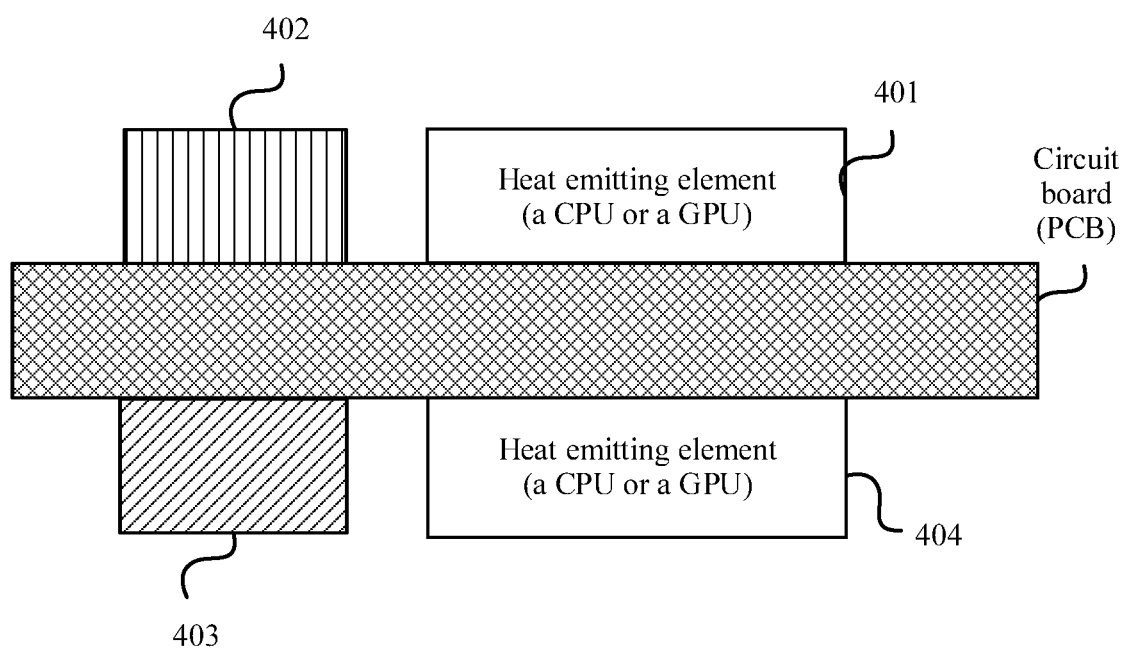
FIG. 5 is a schematic structural diagram of an electronic device according to Manner 2 in Embodiment 3 of this application.

As shown in FIG. 5, in a second manner, the first heat pipe 402 is connected to the heat emitting element 401 by using the thermally conductive metal and the second heat pipe 403 is connected to the heat emitting element 404 using the thermally conductive metal, and the thermally conductive metal is a copper layer of the PCB.

In this embodiment, disposing the heat pipe beside the heat emitting element may further reduce an impact of the heat pipe on a thickness of the electronic device to the greatest extent.

In this embodiment of the present disclosure, to better achieve a heat dissipation effect, the first heat pipe 402 may be a low-temperature efficient heat pipe, and the second heat pipe 403 may be a high-temperature efficient heat pipe.

In this embodiment of the present disclosure, the characteristic parameter is one or more of a pipe diameter of a heat pipe, a capillary layer cross-sectional area of a heat pipe, a working substance amount of a heat pipe, a working substance type of a heat pipe, a pipe material of a heat pipe (the pipe material of a heat pipe in this embodiment of the present disclosure may be copper or aluminum), or a pipe material thickness of heat pipes of a same pipe material.

The characteristic parameter of the high-temperature efficient heat pipe and that of the low-temperature efficient heat pipe are set in Embodiment 2 and Embodiment 3 in the foregoing in a same manner as Embodiment 1. For details, reference may be made to descriptions of Embodiment 1, and the details are not described herein.

One or more embodiments of the present disclosure can achieve at least the following technical effects.

In the solutions provided in the embodiments of the present disclosure, a corresponding heat pipe group is disposed on a same heat emitting element. The heat pipe group includes at least two heat pipes, and optimal working regions of the heat pipes are different, that is, maximum heat transfer quantities of the heat pipes may be different. As a result, the heat pipes with different characteristic parameters may perform heat dissipation processing on the heat emitting element in different working states. Therefore, a technical problem in some approaches that an electronic device has poor heat dissipation performance is resolved, and the heat dissipation performance of the electronic device is improved.

It may be understood that, when power consumption of the heat emitting element is relatively high (for example, the power consumption is approximately at least 10 W), one heat pipe in the heat pipe group is started to perform heat dissipation on the heat emitting element. In this case, the heat pipe is referred to as a high-temperature efficient heat pipe, where high-temperature may mean that a heat pipe performs heat dissipation on the heat emitting element if the power consumption of the heat emitting element is relatively high, and efficient may mean that the heat pipe can effectively dissipate heat of the heat emitting element if the power consumption of the heat emitting element is relatively high. When the power consumption of the heat emitting element is relatively low (for example, the power consumption is approximately 2-3 W), another heat pipe in the heat pipe group is started to perform heat dissipation on the heat emitting element. In this case, the another heat pipe is referred to as a low-temperature efficient heat pipe, where low-temperature may mean that the another heat pipe performs heat dissipation on the heat emitting element if the power consumption of the heat emitting element is relatively low, and efficient may mean that the another heat pipe can effectively dissipate heat of the heat emitting element if the power consumption of the heat emitting element is relatively low.

In addition, according to the solutions provided in the embodiments of the present disclosure, the following problems are avoided: when a high power consumption heat pipe is used at low power consumption, thermal resistance is high, and heat transfer performance is poor; and when a low power consumption heat pipe is used at high power consumption, a boiling-away phenomenon occurs, and therefore, the heat pipe fails and have a poor heat transfer capability.

The electronic device may be any electronic device such as a mobile phone, a tablet computer, or a game console.

A composite heat pipe provided in the embodiments of the present disclosure can be flexibly arranged according to a feature of a compact layout of a mobile phone product, so as to implement a compact volume and a PCB layout limitation, reduce design constraints, and particularly, exert the performance of the low-temperature efficient heat pipe.

Although preferred embodiments of the present disclosure have been described, a person skilled in the art may make variations and modifications to these embodiments once they learn the basic inventive concept. Therefore, the following claims are intended to be construed as to cover the preferred embodiments and all variations and modifications falling within the scope of the present disclosure.

Obviously, a person skilled in the art may make various modifications and variations to the embodiments of the present disclosure without departing from the spirit and scope of the embodiments of the present disclosure. The present disclosure is intended to cover these modifications and variations provided that they fall within the scope defined by the following claims and their equivalent technologies.

What is claimed is:
1. An electronic device comprising:
a printed circuit board (PCB);
a heat emitting element disposed on the PCB; and
a heat pipe group coupled to the heat emitting element, the heat pipe group comprising:

a first heat pipe coupled to the heat emitting element and comprising a first low thermal resistance within a first working region, the first working region defining a first power dissipation region with the first low thermal resistance and a first heat conduction path during low power consumption of the heat emitting element, the first heat pipe conducting a heat load up to a first heat load within the first working region, the first heat pipe comprising a first characteristic parameter; and a second heat pipe coupled to the heat emitting element and comprising a second low thermal resistance within a second working region, the second working region of the second heat pipe defining a second power dissipation region with the second low thermal resistance and a second heat conduction path during high power consumption of the heat emitting element, the second heat pipe conducting a heat load exceeding the first heat load within the second working region, the second heat pipe comprising a second characteristic parameter, the first heat conduction path being different than the second heat conduction path, a thermal resistance range of the first heat pipe and the second heat pipe being 0.05-1 degrees Celsius per watt (° C./W) when the first heat pipe works in the first working region and the second heat pipe works in the second working region, and the low power consumption of the heat emitting element being lower than the high power consumption of the heat emitting element, the first characteristic parameter and the second characteristic parameter comprising a working substance type, the first heat pipe comprising a first latent heat of vaporization of a first working substance type injected in a longitudinal cavity of the first heat pipe and the second heat pipe comprising a second latent heat of vaporization of a second working substance type injected in a longitudinal cavity of the second heat pipe, and the second heat pipe being a high-temperature efficient heat pipe and the first heat pipe being a low-temperature efficient heat pipe when the first latent heat of vaporization is greater than the second latent heat of vaporization.

2. The electronic device of claim 1, wherein the first characteristic parameter and the second characteristic parameter are different characteristic parameters, the different characteristic parameters further comprise at least one characteristic parameter selected from the group comprising a pipe diameter, a capillary layer cross-sectional area, a working substance amount, a pipe material, and a pipe material thickness.

3. The electronic device of claim 2, wherein the first characteristic parameter comprises a first pipe diameter and the second characteristic parameter comprises a second pipe diameter, and the second heat pipe being a high-temperature efficient heat pipe and the first heat pipe being a low-temperature efficient heat pipe when the first pipe diameter is lesser relative to the second pipe diameter.

4. The electronic device of claim 2, wherein the first characteristic parameter and the second characteristic parameter comprise the capillary layer cross-sectional area, the first heat pipe comprising a first capillary layer cross-sectional area and the second heat pipe comprising a second capillary layer cross-sectional area, and the second heat pipe is a high-temperature efficient heat pipe and the first heat pipe is a low-temperature efficient heat pipe when the first capillary layer cross-sectional area is lesser than the second capillary layer cross-sectional area.

5. The electronic device of claim 2, wherein the first characteristic parameter and the second characteristic parameter comprise the working substance amount, the first heat pipe comprising a first working substance amount injected in a longitudinal cavity of the first heat pipe and the second heat pipe comprising a second working substance amount injected in a longitudinal cavity of the second heat pipe, and the second heat pipe being a high-temperature efficient heat pipe and the first heat pipe being a low-temperature efficient heat pipe when the second working substance amount is equal to or greater than a capillary requirement and the first working substance amount is less than the capillary requirement.

6. The electronic device of claim 1, further comprising a thermal interface material disposed between the heat emitting element and the heat pipe group.

7. The electronic device of claim 1, wherein the heat emitting element is a central processing unit (CPU), a graphics processing unit (GPU), or both a CPU and a GPU.

8. An electronic device comprising:
a printed circuit board (PCB);
a heat emitting element disposed on the PCB; and
a heat pipe coupled to the heat emitting element, the heat pipe comprising a first and a second heat conduction path, the heat pipe having a first low thermal resistance within a first working region of the heat pipe and a second low thermal resistance within a second working region of the heat pipe, the first working region defining a first power dissipation region with the first low thermal resistance and a first heat conduction path during a first power consumption of the heat emitting element, the first heat pipe conducting a heat load up to a first heat load within the first working region, the second working region defining a second power dissipation region with the second low thermal resistance and a second heat conduction path during a second power consumption of the heat emitting element, the heat pipe conducting a heat load exceeding the first heat load within the second working region, the first heat conduction path being different than the second heat conduction path, and a thermal resistance range of the first heat conduction path and the second heat conduction path of the heat pipe is 0.05-1 degrees Celsius per watt (° C./W) when the first heat conduction path and the second heat conduction path of the heat pipe works in the first working region and works in the second working region, the first power consumption of the heat emitting element being lower than the second power consumption of the heat emitting element, the first heat conduction path having a first characteristic parameter and the second heat conduction path having a second characteristic parameter, the first characteristic parameter and the second characteristic parameter comprising a working substance type, the heat pipe comprising a first latent heat of vaporization of a first working substance type injected in a longitudinal cavity of the heat pipe and a second latent heat of vaporization of a second working substance type injected in the longitudinal cavity of the heat pipe, and the first latent heat of vaporization is greater than the second latent heat of vaporization.

9. The electronic device of claim 8, wherein the first characteristic parameter and the second characteristic parameter are different characteristic parameters, the different characteristic parameters further comprise at least one characteristic parameter selected from the group comprising a diameter, a capillary layer cross-sectional area, a working substance amount, a pipe material, or a pipe material thickness.

10. The electronic device of claim 8, further comprising a thermal interface material disposed between the heat emitting element and the heat pipe.

11. An electronic device comprising:
a printed circuit board (PCB) comprising a front side and a back side;
a heat emitting element disposed on the front side;
a first heat pipe disposed on the front side and connected to the heat emitting element, the first heat pipe comprising a first characteristic parameter, the first heat pipe having a first low thermal resistance within a first working region, the first working region defining a first power dissipation region with the first low thermal resistance and a first heat conduction path during low power consumption of the heat emitting element, the first heat pipe conducting a heat load up to a first heat load within the first working region; and
a second heat pipe disposed on the back side and connected to the heat emitting element with a thermally conductive metal, the second heat pipe comprising a second characteristic parameter, the second heat pipe comprising a second low thermal resistance within a second working region, the second working region of the second heat pipe defining a second power dissipation region with a second low thermal resistance and a second heat conduction path during high power consumption of the heat emitting element, the second heat pipe conducting a heat load exceeding the first heat load within the second working region, the low power consumption being lower than the high power consumption of the heat emitting element, the first working region being different than the second working region and the first heat conduction path being different than the second heat conduction path, and a thermal resistance range of the first heat pipe and the second heat pipe is 0.05-1 degrees Celsius per watt (° C./W) when the first heat pipe works in the first working region and the second heat pipe works in the second working region, the first characteristic parameter and the second characteristic parameter comprising a working substance type, the first heat pipe comprising a first latent heat of vaporization of a first working substance type injected in a longitudinal cavity of the first heat pipe and the second heat pipe comprising a second latent heat of vaporization of a second working substance type injected in a longitudinal cavity of the second heat pipe, and the second heat pipe being a high-temperature efficient heat pipe and the first heat pipe being a low-temperature efficient heat pipe when the first latent heat of vaporization is greater than the second latent heat of vaporization.

12. The electronic device of claim 11, wherein the first heat pipe is located on the heat emitting element, and the electronic device further comprising a thermal interface material disposed between the first heat pipe and the heat emitting element.

13. The electronic device of claim 11, wherein the first characteristic parameter and the second characteristic parameter are different characteristic parameters, the different characteristic parameters comprising at least one characteristic selected from the group comprising a pipe diameter, a capillary layer cross-sectional area, a working substance amount, a pipe material, or a pipe material thickness.

14. The electronic device of claim 11, wherein the PCB comprises a thermally conductive metal connecting the first heat pipe to the heat emitting element.

* * * * *